(12) United States Patent
Morigami et al.

(10) Patent No.: US 8,664,088 B2
(45) Date of Patent: Mar. 4, 2014

(54) MANUFACTURING A HEAT SINK MATERIAL USING A DISCHARGE WIRE

(75) Inventors: Hideaki Morigami, Itami (JP); Takashi Ishii, Itami (JP)

(73) Assignee: A.L.M.T., Tokyo (JP)

( * ) Notice: Subject to any disclaimer, the term of this patent is extended or adjusted under 35 U.S.C. 154(b) by 362 days.

(21) Appl. No.: 13/026,623

(22) Filed: Feb. 14, 2011

(65) Prior Publication Data

US 2011/0138627 A1 Jun. 16, 2011

Related U.S. Application Data

(62) Division of application No. 11/587,036, filed as application No. PCT/JP2005/017245 on Sep. 20, 2005, now abandoned.

(30) Foreign Application Priority Data

Dec. 8, 2004 (JP) ................................. 2004-354897

(51) Int. Cl.
*H01L 21/00* (2006.01)

(52) U.S. Cl.
USPC ........................................ 438/460; 219/69.12

(58) Field of Classification Search
USPC ........................................ 438/460; 219/69.12
See application file for complete search history.

(56) References Cited

U.S. PATENT DOCUMENTS 4,803,326 A * 2/1989 Kiyoshi ..................... 219/69.12

FOREIGN PATENT DOCUMENTS

| EP | 0 949 727 A | 10/1999 |
|---|---|---|
| EP | 1 452 614 A | 9/2004 |
| JP | 6-125143 | 5/1994 |
| JP | 11-262821 | 9/1999 |
| JP | 11-346029 | 12/1999 |
| JP | 2000-22284 | 1/2000 |
| JP | 2000-323632 | 11/2000 |
| JP | 2001-156320 | 6/2001 |

OTHER PUBLICATIONS

European Search Report issued in European Patent Application No. EP 05 78 5955.5 dated Nov. 13, 2009.

* cited by examiner

*Primary Examiner* — Laura Menz
*Assistant Examiner* — Candice Y Chan
(74) *Attorney, Agent, or Firm* — McDermott Will & Emery LLP

(57) ABSTRACT

Provided are a heat sink material made of an alloy or a composite material including two or more types of elements which has an end surface that makes possible formation of an edge portion on which at least a laser element is mounted, a manufacturing method for the same, and a semiconductor laser device including the heat sink material. A heat sink material (10) is made of an alloy or a composite material including two or more types of elements, and provided with a main surface having a relatively large area and a secondary surface having a relatively small area which crosses the main surface, and the secondary surface includes a surface on which a discharging process has been carried out using a discharge wire (200) that is placed approximately parallel to the main surface. The manufacturing method for the heat sink material (10) is provided with the steps of placing the discharge wire (200) on a material (100, 50) to be approximately parallel to the main surface, and carrying out the discharging process on the material (100, 50) using the discharge wire (200) placed as described above.

1 Claim, 5 Drawing Sheets

(A)

(B)

(C)

(D)

(E)

(A)

(B)

(C)

(A)

(B)

(C)

(D)

(E)

MANUFACTURING A HEAT SINK MATERIAL USING A DISCHARGE WIRE

RELATED APPLICATIONS

This application is a Divisional of U.S. patent application Ser. No. 11/587,036, filed on Oct. 20, 2006 now abandoned, which is the U.S. National Phase under 35 U.S.C. §371 of International Application No. PCT/JP2005/017245, filed on Sep. 20, 2005, which in turn claims the benefit of Japanese Application No. 2004-354897, filed on Dec. 8, 2004, the disclosures of which Applications are incorporated by reference herein.

TECHNICAL FIELD

This invention generally relates to a heat sink material, a manufacturing method for the same, and a semiconductor laser device, and in particular, to a heat sink material of a semiconductor laser element (laser diode (LD)) for a bar laser, a manufacturing method for the same, and a semiconductor laser device having the semiconductor laser element for a bar laser and the heat sink material.

BACKGROUND ART

A heat sink having a desired and extremely high surface precision to the edge portions and a method for processing the same, which allows for stably gaining such a heat sink, are proposed in, for example, Japanese Unexamined Patent Publication 2000-22284 (Patent Document 1). This method for processing a heat sink is a method for processing a heat sink that forms a semiconductor laser element, and is characterized by having the step of forming a number of long members in rod form by cutting a member in plate form, where a first mirror surface is formed on at least one surface, the step of forming a second mirror surface by carrying out a cutting process on the upper surface of the number of members in rod form, which are secured to a jig in order to be approximately parallel to each other in a state where the first mirror surface stands approximately vertically so that an edge portion is formed between the first mirror surface and the second mirror surface, and the step of gaining a number of heat sinks by cutting the members in rod form. In addition, this method for processing a heat sink is characterized by having the step of processing one surface of a member in plate form into a mirror surface, the step of forming edge portions between the mirror surface and trenches that are created by carrying out a discharging process or a laser process on the mirror surface of the member in plate form, and the step of gaining a number of heat sinks by cutting the member in plate form along the trenches. A copper based material having excellent thermal conductivity is used as the material of this type of heat sink. Patent Document 1: Japanese Unexamined Patent Publication 2000-22284

DISCLOSURE OF THE INVENTION

Problem to be Solved by the Invention

Chips of a bar laser element for processing or for industrial use are large so as to be as long as approximately 10 mm, and the basic material thereof is formed of a gallium arsenic compound semiconductor material. Therefore, the properties of heat sinks for a bar laser element are required to have a coefficient of linear expansion, which is approximately the same as that of the gallium arsenic compound semiconductor material in addition to a high thermal conductivity. As for the materials which satisfy such required properties, copper-tungsten alloys, copper-diamond composite materials and the like, of which the average coefficient of linear expansion is no less than $3.0 \times 10^{-6}$/K and no greater than $9.0 \times 10^{-6}$/K at a temperature ranging from room temperature to 400° C., and the thermal conductivity is no less than 100 W/m·K, are regarded as promising.

Meanwhile, heat sinks for a laser element are required to have a small radius of curvature (R) at the edge portions, small chipped portions, if any, in the edge portions and no burrs in the edge portions in order to release heat from the laser emitting layer without fail. In the case where the radius of curvature at the edge portions is great, heat is prevented from being released to the heat sink from the laser element when the laser element is mounted on the heat sink in such a manner that the end surface of the laser emitting layer matches an edge portion of the heat sink. In the same manner, in the case where an edge portion has a large chipped portion, heat is prevented from being released to the heat sink from the laser element. In the case where there is a burr at an edge portion, a gap exists between the laser element and the heat sink, and therefore, heat is prevented from being released to the heat sink from the laser element.

In accordance with the processing method that is disclosed in the above described gazette, edge portions having a small radius of curvature and small chipped portions can be gained, and burrs can be prevented from being created at the edge portions in the case where a heat sink is processed from a copper based material of which the main component is copper. It is difficult, however, to gain desired edge portions in accordance with the above described processing method from a composite material such as a copper-tungsten alloy, a copper-diamond composite material or the like where materials having different processability are mixed. Therefore, to gain a desired edge portion, it is necessary to carry out post processing such as a cutting process in order to adjust the form of the end surface after the cutting step for the formation of an edge portion has been carried out. In addition, a problem arises with a heat sink, which has an end surface that has been gained only in the cutting process, where a laser element cannot be mounted on the heat sink due to the existence of a burr or a protrusion on the end surface.

As for a composite material where copper and a material that is harder than copper are combined, for example, it is difficult to find process conditions which can be applied to both copper and the hard material that form this composite material even in the case where process conditions which are appropriate for copper and the hard material that form this composite material, respectively, are found. There are problems, for example, where copper creates a burr at an edge portion in accordance with a cutting process, and the hard material chips in an edge portion (a chipped portion is created). In this case, it is difficult to prevent both a burr and a chipped portion from being created in an edge portion.

Therefore, an object of this invention is to provide a heat sink material which is made of an alloy or a composite material including two or more types of elements, and has an end surface that makes possible formation of an edge portion on which at least a laser element is mounted, a manufacturing method for the same, and a semiconductor laser device having such a heat sink material.

Means for Solving the Problems

The heat sink material according to this invention is made of an alloy or a composite material including two or more types of elements and provided with a main surface having a relatively large area and a secondary surface having a relatively small area which crosses the main surface, wherein the secondary surface includes a surface on which a discharging process has been carried out using a discharge wire that is placed approximately parallel to the main surface.

In the heat sink material according to this invention, the secondary surface having a relatively small area includes a surface on which the discharging process has been carried out using the discharge wire that has been placed approximately parallel to the main surface, and therefore, a further discharging process can be carried out on the secondary surface using the discharge wire that has been placed approximately parallel to the main surface, and thereby, an edge (edge portion) having a small radius of curvature and small chipped portions can be gained, and thus, a burr can be prevented from being created in the edge portion. In other words, the secondary surface of the heat sink material according to the present invention has an end surface that makes formation of an edge portion on which at least a laser element is mounted possible.

In the heat sink material according to this invention, it is preferable for an approximate radius of curvature at an edge where the main surface and the secondary surface cross to be no greater than 30 μm.

In this case, when a laser element is mounted on the heat sink in such a manner that the end surface of an laser emitting layer is aligned with the edge (edge portion) of the heat sink material, heat can be effectively released from the portion directly beneath the laser emitting layer (active layer) to the heat sink material.

In addition, on the secondary surface of the heat sink material according to this invention, it is preferable for the number of chipped portions having a width of no greater than 30 μm and a length of no greater than 50 μm, which exist per 1 mm on a length of the edge portion to be no greater than 10.

In this case, when a laser element is mounted on the heat sink in such a manner that the end surface of the laser emitting layer is aligned with the edge (edge portion) of the heat sink material, heat can be effectively released from the portion directly beneath the laser emitting layer (active layer) to the heat sink material.

Furthermore, it is preferable for the alloy or composite material that forms the heat sink material according to this invention to have an average coefficient of linear expansion of no less than $3.0 \times 10^{-6}$/K and no greater than $9.0 \times 10^{-6}$/K at a temperature ranging from room temperature to 400° C., and a thermal conductivity of no less than 100 W/m·K.

In this case, thermal stress can be prevented from being caused when a laser element is heated and joined to the heat sink material, and heat that is emitted when light is emitted from the laser element can be effectively conveyed to the heat sink material.

It is preferable for a material that forms the heat sink material according to this invention to be a material including two types of metals or a material including a metal and hard particles.

In particular, it is preferable for the material that forms the heat sink material according to this invention to be one type of material selected from the group consisting of an alloy including copper and tungsten, a composite material including diamond particles and copper, an alloy including copper and molybdenum, and a composite material including silicon carbide and aluminum.

In addition, it is preferable for the heat sink material according to this invention to have a metal film formed at least on the main surface.

The semiconductor laser device according to this invention is provided with: the heat sink material having at least any of the above described characteristics; and a semiconductor laser element chip that is secured to the top of the main surface of this heat sink material, wherein an end surface of this semiconductor laser element chip is positioned on the main surface at a distance of no greater than 10 μm from the edge portion where the main surface and the secondary surface of the heat sink material cross.

The manufacturing method for a heat sink material according to this invention is provided with the steps of placing a discharge wire, on a material made of an alloy or a composite material including two or more types of elements and having a main surface which has a relatively large area and a secondary surface which has a relatively small area and crosses the main surface, to be approximately parallel to the main surface; and carrying out a discharging process on the material using the discharge wire placed as describe above.

According to the manufacturing method for the heat sink material of this invention, the discharging process is carried out on the secondary surface having a relatively small area using the discharge wire that has been placed approximately parallel to the main surface, and therefore, a further discharging process can be carried out on the secondary surface using the discharge wire that has been placed approximately parallel to the main surface, and thereby, an edge portion having a small radius of curvature and small chipped portions can be gained, and thus, a burr can be prevented from being created in the edge portion. In other words, the secondary surface of the heat sink material that has been processed according to the manufacturing method of the present invention has an end surface that makes formation of the edge portion on which at least a laser element is mounted possible.

In the manufacturing method for the heat sink material according to this invention, it is preferable for the discharging process to include the steps of cutting the material, roughly finishing the cut surface, and finely finishing the cut surface.

In this case, the discharging process is carried out step by step on the secondary surface, and thereby, an edge portion having a small radius of curvature and small chipped portions can be gained, and a burr can be prevented from being created in the edge portion.

Effects of the Invention

As described above, according to this invention, a heat sink material made of an alloy or a composite material including two or more types of elements which is provided with an end surface that makes formation of an edge portion on which at least a laser element is mounted possible can be gained, and a further discharging process can be carried out on this heat sink material, so that an edge portion having a small radius of curvature and small chipped portions is gained, and a burr can be prevented from being created in the edge portion, and therefore, heat release from the laser element to the heat sink material can be improved.

EXPLANATION OF THE SYMBOLS

Figure 1:
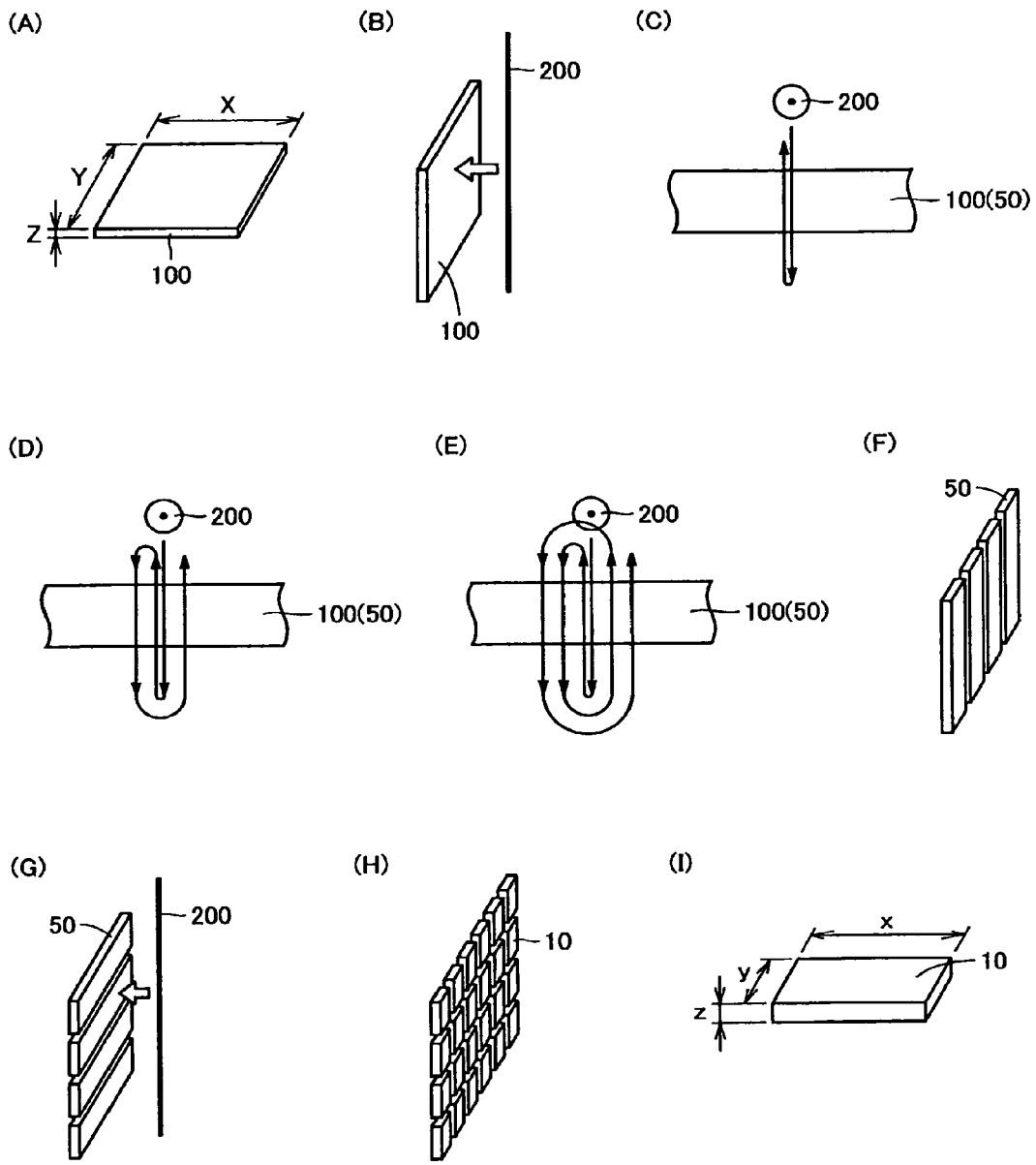
FIG. 1 is a diagram showing the sequence steps in a manufacturing method for a heat sink material according to an example of this invention.

1: heat sink; 2: semiconductor laser element chip; 10: heat sink material; 11: nickel plating layer or nickel vapor deposition layer; 12: platinum film; 50, 100: material; 200: discharge wire

BEST MODE FOR CARRYING OUT THE INVENTION

A heat sink material according to one embodiment of this invention is made of an alloy or a composite material including two or more types of elements, and is gained by preparing a material with a main surface having a relatively large area and a secondary surface having a relatively small area which crosses this main surface, and carrying out a discharging process on at least the secondary surface using a discharge wire that is placed approximately parallel to the main surface.

It is preferable for the discharging process to be carried out in the discharging process step in no less than three stages, the cutting step using a discharge wire processor, the step of roughly finishing the cut surface, and the step of finely finishing the cut surface. In this case, it is preferable for the amount of offset in the discharging process to be no greater than 100% of the diameter of the discharge wire in the step of roughly finishing the cut surface and the step of finely finishing the cut surface, it is more preferable for it to be no greater than 50%, and it is more preferable for it to be no greater than 30%. If the ratio of the amount of offset in the discharging process to the diameter of the discharge wire exceeds 100%, the load applied to the object being processed in the discharging process becomes large, causing chipping or sagging in the edge portion of the heat sink material which is the object being processed, and in addition, the amount cut from the object being processed increases and the quantity of heat sink material that can be taken from the material is reduced, and thus, the cost of manufacture increases.

In the heat sink material according to one embodiment of the present invention, it is preferable for the approximate radius of curvature (R) at the edge where the main surface and the secondary surface cross to be no greater than 30 µm, and concretely, it is preferable for the radius of curvature (R) of the portion sagging from the edge of at least one long side on the two planes having a large area from among the planes that form a rectangular parallelepiped to be no greater than 30 µm, it is more preferable for it to be no greater than 20 µm, and it is most preferable for it to be no greater than 10 µm. If the above described radius of curvature exceeds 30 µm, when a laser element is mounted on the heat sink in such a manner that the end surface of the laser emitting layer (active layer) is aligned with the edge (edge portion) of the heat sink material, heat release from the portion directly beneath the active layer, which is a portion of the semiconductor laser element that is mounted on top of the main surface of the heat sink material from which a laser is emitted, becomes insufficient, and the desired laser output cannot be gained. Here, the above described radius of curvature is at least no less than 1 µm. In order to carry out a discharging process in such a manner that the above described radius of curvature becomes less than 1 µm, it is necessary to reduce the output in the discharging process and reduce the speed of processing, which is not economical from the point of view of efficiency of processing, and thus not preferable.

In addition, in the heat sink material according to one embodiment of the present invention, it is preferable for the number of chipped portions (chipping) of which the width is no greater than 30 µm and length is no greater than 50 µm, and which exist on the secondary surface per 1 mm on the length of the edge to be no greater than 10. It is more preferable for the width of the chipped portions to be no greater than 15 µm and the length to be no greater than 30 µm, it is more preferable for the width of the chipped portions to be no greater than 5 µm and the length to be no greater than 10 µm, and it is more preferable for the number of the chipped portions to be no greater than 5 per 1 mm on the length of the edge, and it is most preferable for it to be no greater than 1. If the width of the chipped portions exceeds 30 µm, or the length of the chipped portions exceeds 50 µm, when a laser element is mounted on the heat sink in such a manner that the end surface of the laser emitting layer (active layer) is aligned with the edge (edge portion) of the heat sink material, heat release from the portion directly beneath the active layer, which is a portion of the semiconductor laser element that is mounted on top of the main surface of the heat sink material from which a laser is emitted, becomes insufficient, and the desired laser output cannot be gained. In the case where the number of chipped portions per 1 mm on the length of the edge exceeds 10, heat release becomes insufficient directly beneath some portions from among the portions from which a laser is emitted and which are aligned with a pitch of 100 µm on, for example, a laser element having a length of 10 mm.

It is preferable for the average coefficient of linear expansion of the material that forms the heat sink material to be no lower than $3.0 \times 10^{-6}$/K and no higher than $9.0 \times 10^{-6}$/K at a temperature ranging from room temperature to 400° C., it is more preferable for it to be no lower than $4.0 \times 10^{-6}$/K and no higher than $8.0 \times 10^{-6}$/K, and it is most preferable for it to be no lower than $5.0 \times 10^{-6}$/K and no higher than $7.5 \times 10^{-6}$/K. If the average coefficient of linear expansion is lower than $3.0 \times 10^{-6}$/K or exceeds $9.0 \times 10^{-6}$/K, the difference in the coefficient of thermal expansion with a gallium arsenic compound semiconductor of which the average coefficient of linear expansion is $5.9 \times 10^{-6}$/K and which forms the base material of the semiconductor laser element becomes great, and therefore, when a semiconductor laser element is heated and joined to the top of the heat sink material, thermal stress is caused, making the performance of the laser element unstable, and the operation life is shortened, and in some cases, the laser element is damaged.

It is preferable for the thermal conductivity of the material that forms the heat sink material to be no less than 100 W/m·K, it is more preferable for it to be no less than 150 W/m·K, and it is most preferable for it to be no less than 400 W/m·K. If the thermal conductivity is less than 100 W/m·K, heat that is emitted from the laser element cannot be sufficiently released, and therefore, the desired high laser output cannot be gained.

It is preferable for the material that forms the heat sink material to be an alloy including copper and tungsten, a composite material including diamond and copper, an alloy including copper and molybdenum, or a composite material including silicon carbide and aluminum.

In the case where an alloy including copper and tungsten is used as the material that forms the heat sink material, it is preferable for the material to include copper of no less than 5 mass %, it is more preferable for the content of copper to be no less than 5 mass % and no greater than 40 mass %, and it is most preferable for it to be no less than 10 mass % and no greater than 20 mass %. In the case where the content of copper is less than 5 mass %, the average coefficient of linear expansion of the copper-tungsten alloy is smaller than the average coefficient of linear expansion, which is $5.9 \times 10^{-6}$/K, of a gallium-arsenic compound semiconductor that forms the base material of the semiconductor laser element, and therefore, when a semiconductor laser element is heated and joined to the top of the heat sink material, thermal stress is caused, making it easy for the semiconductor laser element to come off, and as a result, the lifetime of the laser element and its reliability over a long period of time are negatively affected.

In the case where a composite material including diamond and copper is used as the material that forms the heat sink material, it is preferable for the material to include Ib type diamond particles of which the particle diameter are no less than 5 μm and no greater than 100 μm, it is more preferable for the particle diameter of the diamond particles to be no less than 10 μm and no greater than 60 μm, and it is most preferable for it to be no less than 20 μm and no greater than 50 μm. In the case where the particle diameter is less than 5 μm, the thermal resistance becomes great due to an increase in the area of the interface with copper particles, and the thermal conductivity of the composite material is lowered. In the case where the particle diameter exceeds 100 μm, the size of the chipped portions in the edge portion becomes great, and the cut end surface also becomes highly coarse when diamond particles fall off during the processing of the heat sink material. It is preferable for the content of copper to be no less than 19 mass % and no greater than 76 mass %, it is more preferable for it to be no less than 29 mass % and no greater than 66 mass %, and it is most preferable for it to be no less than 38 mass % and no greater than 52 mass %. In the case where the content of copper is less than 19 mass %, the average coefficient of linear expansion of the composite material is smaller than the average coefficient of linear expansion, which is $5.9 \times 10^{-6}$/K, of a gallium-arsenic compound semiconductor that forms the base material of the semiconductor laser element, and therefore, when a semiconductor laser element is heated and joined to the top of the heat sink material, thermal stress is caused, making it easy for the semiconductor laser element to come off, and as a result, the lifetime of the laser element and its reliability over a long period of time are negatively affected. In addition, in the case where the content of copper exceeds 76 mass %, the average coefficient of linear expansion of the composite material is greater than the average coefficient of linear expansion, which is $5.9 \times 10^{-6}$/K, of a gallium-arsenic compound semiconductor that forms the base material of the semiconductor laser element, and therefore, when a semiconductor laser element is heated and joined to the top of the heat sink material, thermal stress is caused, making it easy for the semiconductor laser element to come off, and as a result, the lifetime of the laser element and its reliability over a long period of time are negatively affected.

In the case where an alloy including copper and molybdenum is used as the material that forms the heat sink material, it is preferable for the material to include copper of no less than 5 mass %, it is more preferable for the content of copper to be no less than 5 mass % and no greater than 60 mass %, and it is most preferable for it to be no less than 5 mass % and no greater than 35 mass %. In the case where the content of copper is less than 5 mass %, the average coefficient of linear expansion of the copper-molybdenum alloy is smaller than the average coefficient of linear expansion, which is $5.9 \times 10^{-6}$/K, of a gallium-arsenic compound semiconductor that forms the base material of the semiconductor laser element, and therefore, when a semiconductor laser element is heated and joined to the top of the heat sink material, thermal stress is caused, making it easy for the semiconductor laser element to come off, and as a result, the lifetime of the laser element and its reliability over a long period of time are negatively affected.

In the case where a composite material including silicon carbide and aluminum is used as the material that forms the heat sink material, it is preferable for the material to include aluminum of no greater than 70 mass %. In the case where the content of aluminum exceeds 70 mass %, the average coefficient of linear expansion of the composite material is greater than the average coefficient of linear expansion, which is $5.9 \times 10^{-6}$/K, of a gallium-arsenic compound semiconductor that forms the base material of the semiconductor laser element, and therefore, when a semiconductor laser element is heated and joined to the top of the heat sink material, thermal stress is caused, making it easy for the semiconductor laser element to come off, and as a result, the lifetime of the laser element and its reliability over a long period of time are negatively affected.

It is preferable for a main surface of the heat sink material according to this invention to have at least a metal film formed thereon, and concretely, it is preferable for the two main surfaces, the upper surface on which a semiconductor laser element is mounted and the lower surface, to have a metal film formed thereon.

The semiconductor laser device according to one embodiment of this invention is provided with a heat sink material having any of the above described characteristics and a semiconductor laser element chip, which is secured to the top of the main surface of this heat sink material. The end surface of the semiconductor laser element chip is positioned on the main surface at a distance of no greater than 10 μm from an edge of the heat sink material where the main surface and a secondary surface cross. Concretely, the semiconductor laser element chip is secured to the top of the main surface of the heat sink material by means of soldering in such a manner that an edge of a long side of the semiconductor laser element (laser diode (LD)) chip is positioned at a distance of no greater than 10 μm from an edge on one plane of the heat sink material having a large area. It is more preferable for the above described distance to be no greater than 5 μm, and it is most preferable for it to be no greater than 3 μm. In the case where the above described distance exceeds 10 μm, the path of the laser beam that is emitted from the semiconductor laser element chip with a certain range of spread is interfered with by the edge of the heat sink material, and the laser beam is disturbed.

EXAMPLES

Heat sink materials are fabricated by processing a variety of materials under the conditions for a cutting process shown in Table 1.

The composition of the "material" in Table 1 is as follows.

Cu—W alloy 1: alloy including 11 mass % of copper and 89 mass % of tungsten

Cu—W alloy 2: alloy including 11 mass % of copper and 89 mass % of tungsten

Cu—W alloy 3: alloy including 20 mass % of copper and 80 mass % of tungsten

Cu-Diamond: composite material of copper-diamond particles including 46 mass % of copper Al—SiC: composite material of aluminum-silicon carbide particles including 30 mass % of aluminum Cu: pure copper The Cu—W alloys (Cu—W alloy 1 having a thermal conductivity of 180 W/m·K and a coefficient of linear expansion of $6.5 \times 10^{-6}$/K, Cu—W alloy 2 having a thermal conductivity of 210 W/m·K and a coefficient of linear expansion of $6.5 \times 10^{-6}$/K, and Cu—W alloy 3 having a thermal conductivity of 200 W/m·K and a coefficient of linear expansion of $8.3 \times 10^{-6}$/K) were manufactured as follows.

A tungsten powder having an average particle diameter of 5 μm and a lubricant (paraffin based) were mixed. This mixed powder was molded under a press with a pressure of 2 t/cm$^2$, and a pressed powder body in rectangular parallelepiped form having dimensions of 42 mm×42 mm×1 mm was fabricated. A binder removing process was carried out on this pressed powder body in a hydrogen atmosphere for five hours at a temperature of 800° C. After that, the pressed powder body was sintered in a hydrogen atmosphere for two hours at a temperature of 1300° C. A copper powder having a purity of 99.9% was placed beneath the gained tungsten porous sintered body, and the copper was melted in this state in a hydrogen atmosphere for two hours at a temperature of 1250° C. so that the copper was infiltrated into the pores of the tungsten porous sintered body, and thereby, a copper-tungsten sintered body was fabricated. A mechanical process was carried out on the gained copper-tungsten sintered body so that it became a rectangular parallelepiped having dimensions of 38 mm×38 mm×0.3 mm.

Here, it is possible to manufacture a copper-tungsten sintered body by mixing and sintering a copper powder and a tungsten powder.

The Cu-Diamond composite material (having a thermal conductivity of 550 W/m·K and a coefficient of linear expansion of $6.0 \times 10^{-6}$/K) was manufactured as follows.

A commercially available diamond powder having a grain diameter of 75 μm to 95 μm and a copper powder having a purity of 99% and a grain diameter of less than 15 μm were mixed at a mass ratio of 54:46. A metal container made of molybdenum was filled in with this mixed powder, and press molding was carried out with a pressure of 2 t/cm$^2$ so that a pressed powder body in columnar form having dimensions of 50 mm, which was the diameter, ×7 mm, which was the thickness, was fabricated. After that, this metal container was put into a belt type ultrahigh pressure generating unit and maintained for five minutes under the conditions where the pressure was 5 GPa and the temperature was 1100° C., and thereby, a copper-diamond sintered body was fabricated. A cutting process was carried out on the gained copper-diamond sintered body so that it became a rectangular parallelepiped having dimensions of 38 mm×38 mm×0.3 mm.

The Al—SiC composite material was manufactured as follows.

An aluminum powder having an average particle diameter of 25 μm and a silicon carbide powder having an average particle diameter of 50 μm were added together so that the silicon carbide powder became 65 mass %, and were mixed for an hour using a kneader. Press molding was carried out on this mixed powder with a pressure of 5 t/cm$^2$, and a pressed powder body in rectangular parallelepiped form having dimensions of 40 mm×40 mm×1 mm was fabricated. This pressed powder body was sintered in a nitrogen atmosphere for two hours at a temperature of 700° C., and thereby, an aluminum-silicon carbide composite sintered body was fabricated. A machine process was carried out on the gained aluminum-silicon carbide composite sintered body so that it became a rectangular parallelepiped having dimensions of 38 mm×38 mm×0.3 mm.

The "conditions for cutting process" in Table 1 are as follows.

(Discharging Process 1)

Figure 2:
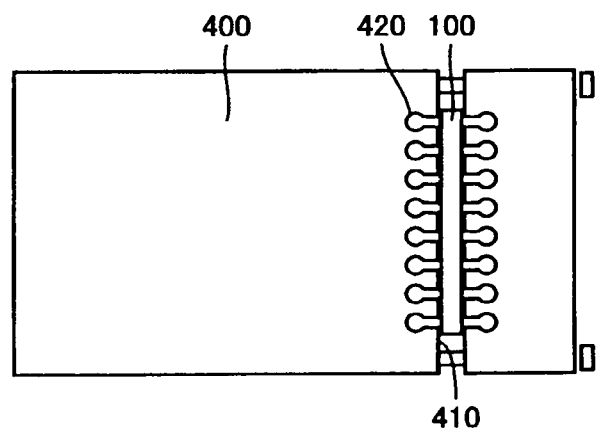
FIG. 2 is a plan diagram showing a jig which is used in a discharging process for a heat sink material according to an example of this invention.

As shown in FIG. 1(A), a material 100 having dimensions of X=38 mm, Y=38 mm and Z=0.3 mm was prepared. The upper and lower surfaces were processed by means of lapping so that the thickness (Z) became 0.3 mm. After that, as shown in FIG. 1(B), a discharge wire 200 was placed approximately parallel to the main surface of the material 100 having a relatively large area, and thus, a discharging process was carried out on the secondary surface having a relatively small area. Concretely, the discharge wire 200 having a diameter of 0.2 mm was moved in the direction indicated by an arrow, and thereby, a cutting process was carried out on the material 100. In this case, as shown in FIG. 2, the discharge wire 200 was passed through a slit 420 in a state where the material 100 was pinched by a jig 400, which was secured by screws, and thus, the material 100 was cut in accordance with the discharging process. When cutting was completed in one slit 420, the discharge wire 200 was automatically cut and moved to an adjacent slit 420, where the wire was automatically connected and the material 100 was sequentially cut in accordance with the discharging process. At this time, as shown in FIG. 1(C), the cutting process was carried out by reciprocating the discharge wire 200 once relative to the material 100. The discharging process conditions at this time were a voltage of 45 V, a current of 5 A and a moving speed of the discharge wire of 1.0 mm/min. In this manner, as shown in FIG. 1(F), materials 50 cut at equal intervals in one direction were gained. After that, the jig 400 in FIG. 2 was rotated by 90°, and thereby, the materials 50 cut at equal intervals in one direction were rotated by 90°, and then, as shown in FIG. 1(G), the discharge wire 200 was placed approximately parallel to the main surface of the materials 50 having a relatively large area, and a discharging process was carried out on the secondary surfaces having a relatively small area. At this time, a cutting process was carried out in the same manner as that shown in FIG. 1(C) by reciprocating the discharge wire 200 once relative to the materials 50. As a result, the materials were converted to chips as shown in FIG. 1(H), and thus, heat sink materials 10 were gained. As shown in FIG. 1(I), the heat sink material 10 had dimensions of x=10 mm, y=2 mm and z=0.3 mm.

(Discharging Process 2)

As shown in FIG. 1(A), the material 100 having dimensions of X=38 mm, Y=38 mm and Z=0.3 mm was prepared. The upper and lower surfaces were processed by means of lapping so that the thickness (Z) became 0.3 mm. After that, as shown in FIG. 1(B), the discharge wire 200 was placed approximately parallel to the main surface of the material 100 having a relatively large area, and thus, a discharging process was carried out on the secondary surface having a relatively small area. Concretely, the discharge wire 200 having a diameter of 0.2 mm was moved in the direction indicated by the arrow, and thereby, a cutting process was carried out on the material 100. In this case, as shown in FIG. 2, the discharge wire 200 was passed through the slit 420 in a state where the material 100 was pinched by the jig 400, which was secured by screws, and thus, the material 100 was cut in accordance with the discharging process. When cutting was completed in one slit 420, the discharge wire 200 was automatically cut and moved to an adjacent slit 420, where the wire was automatically connected and the material 100 was sequentially cut in accordance with the discharging process. At this time, as shown in FIG. 1(D), the cutting process was carried out on the material 100, and a process for roughly finishing the cut surfaces that had been gained through this cutting process was carried out by reciprocating the discharge wire 200 twice relative to the material 100. The discharging process conditions at this time were a voltage of 45 V, a current of 5 A and a moving speed of the discharge wire of 1.0 mm/min for the cutting process, and a voltage of 60 V, a current of 0.5 A and a moving speed of the discharge wire of 1.0 mm/min for the roughly finishing process. The amount of offset in the roughly finishing process was 0.122 mm. In this manner, as shown in FIG. 1(F), materials 50 cut at equal intervals in one direction were gained. After that, the jig 400 in FIG. 2 was rotated by 90°, and thereby, the materials 50 cut at equal intervals in one direction were rotated by 90°, and then, as shown in FIG. 1(G), the discharge wire 200 was placed approximately parallel to the main surface of the materials 50 having a relatively large area, and a discharging process was carried out on the secondary surfaces having a relatively small area. At this time, a cutting process was carried out on the materials 50, and the process for roughly finishing the cut surfaces that had been gained through this cutting process was carried out in the same manner as that shown in FIG. 1(D) by reciprocating the discharge wire 200 twice relative to the materials 50. As a result, the materials were converted to chips as shown in FIG. 1(H), and thus, the heat sink materials 10 were gained. As shown in FIG. 1(I), the heat sink material 10 had dimensions of x=10 mm, y=2 mm and z=0.3 mm.

(Discharging Process 3)

As shown in FIG. 1(A), the material 100 having dimensions of X=38 mm, Y=38 mm and Z=0.3 mm was prepared. The upper and lower surfaces of the materials which were a Cu—W alloy were processed by means of lapping so that the thickness (Z) became 0.3 mm. A polishing process was carried out on the upper and lower surfaces of the materials which were Cu-Diamond and Al—SiC using a plane grinder so that the thickness (Z) became 0.3 mm. After that, as shown in FIG. 1(B), the discharge wire 200 was placed approximately parallel to the main surface of the material 100 having a relatively large area, and thus, a discharging process was carried out on the secondary surface having a relatively small area. Concretely, the discharge wire 200 having a diameter of 0.2 mm was moved in the direction indicated by the arrow, and thereby, a cutting process was carried out on the material 100. In this case, as shown in FIG. 2, the discharge wire 200 was passed through the slit 420 in a state where the material 100 was pinched by the jig 400, which was secured by screws, and thus, the material 100 was cut in accordance with the discharging process. When cutting was completed in one slit 420, the discharge wire 200 was automatically cut and moved to an adjacent slit 420, where the wire was automatically connected and the material 100 was sequentially cut in accordance with the discharging process. At this time, as shown in FIG. 1(E), the cutting process was carried out on the material 100, a process for roughly finishing the cut surfaces that had been gained through this cutting process was carried out, and a process for finely finishing the cut surfaces was carried out by reciprocating the discharge wire 200 three times relative to the material 100. The discharging process conditions at this time were a voltage of 45 V, a current of 5 A and a moving speed of the discharge wire of 1.0 mm/min for the cutting process, a voltage of 60 V, a current of 0.5 A and a moving speed of the discharge wire of 3.5 mm/min for the roughly finishing process, and a voltage of 10 V, a current of 5 A and a moving speed of the discharge wire of 5.5 mm/min for the finely finishing process. The amounts of offset in the roughly finishing process and in the finely finishing process were 0.122 mm and 0.110 mm, respectively. In this manner, as shown in FIG. 1(F), materials 50 cut at equal intervals in one direction were gained. After that, the jig 400 in FIG. 2 was rotated by 90°, and thereby, the materials 50 cut at equal intervals in one direction were rotated by 90°, and then, as shown in FIG. 1(G), the discharge wire 200 was placed approximately parallel to the main surface of the materials 50 having a relatively large area, and the discharging process was carried out on the secondary surfaces having a relatively small area. At this time, the cutting process was carried out on the materials 50, the process for roughly finishing the cut surfaces that had been gained through this cutting process was carried out, and the process for finely finishing the cut surfaces was carried out in the same manner as that shown in FIG. 1(E) by reciprocating the discharge wire 200 three times relative to the materials 50. As a result, the materials were converted to chips as shown in FIG. 1(H), and thus, the heat sink materials 10 were gained. As shown in FIG. 1(I), the heat sink material 10 had dimensions of x=10 mm, y=2 mm and z=0.3 mm.

(Discharging Process 4)

As shown in FIG. 1(A), the material 100 having dimensions of X=38 mm, Y=38 mm and Z=0.3 mm was prepared. The upper and lower surfaces were processed by means of lapping so that the thickness (Z) became 0.3 mm. After that, as shown in FIG. 1(B), the discharge wire 200 was placed approximately parallel to the main surface of the material 100 having a relatively large area, and thus, a discharging process was carried out on the secondary surface having a relatively small area. Concretely, the discharge wire 200 having a diameter of 0.2 mm was moved in the direction indicated by the arrow, and thereby, a cutting process was carried out on the material 100. In this case, as shown in FIG. 2, the discharge wire 200 was passed through the slit 420 in a state where the material 100 was pinched by the jig 400, which was secured by screws, and thus, the material 100 was cut in accordance with the discharging process. When cutting was completed in one slit 420, the discharge wire 200 was automatically cut and moved to an adjacent slit 420, where the wire was automatically connected and the material 100 was sequentially cut in accordance with the discharging process. At this time, as shown in FIG. 1(E), the cutting process was carried out on the material 100, a process for roughly finishing the cut surfaces that had been gained through this cutting process was carried out, and a process for finely finishing the cut surfaces was carried out by reciprocating the discharge wire 200 three times relative to the material 100. The discharging process conditions at this time were a voltage of 90 V, a current of 10 A and a moving speed of the discharge wire of 2.0 mm/min for the cutting process, a voltage of 120 V, a current of 2 A and a moving speed of the discharge wire of 6 mm/min for the roughly finishing process, and a voltage of 20 V, a current of 10 A and a moving speed of the discharge wire of 10 mm/min for the finely finishing process. The amounts of offset in the roughly finishing process and in the finely finishing process were 0.122 mm and 0.110 mm, respectively. In this manner, as shown in FIG. 1(F), materials 50 cut at equal intervals in one direction were gained. After that, the jig 400 in FIG. 2 was rotated by 90°, and thereby, the materials 50 cut at equal intervals in one direction were rotated by 90°, and then, as shown in FIG. 1(G), the discharge wire 200 was placed approximately parallel to the main surface of the materials 50 having a relatively large area, and the discharging process was carried out on secondary surfaces having a relatively small area. At this time, the cutting process was carried out on the materials 50, the process for roughly finishing the cut surfaces that had been gained through this cutting process was carried out, and the process for finely finishing the cut surfaces was carried out in the same manner as that shown in FIG. 1(E) by reciprocating the discharge wire 200 three times relative to the materials 50. As a result, the materials were converted to chips as shown in FIG. 1(H), and thus, the heat sink materials 10 were gained. As shown in FIG. 1(I), the heat sink material 10 had dimensions of x=10 mm, y=2 mm and z=0.3 mm.

(Discharging Process 5)

As shown in FIG. 1(A), the material 100 having dimensions of X=38 mm, Y=38 mm and Z=0.3 mm was prepared. The upper and lower surfaces were processed by means of lapping so that the thickness (Z) became 0.3 mm. After that, as shown in FIG. 1(B), the discharge wire 200 was placed approximately parallel to the main surface of the material 100 having a relatively large area, and thus, a discharging process was carried out on the secondary surface having a relatively small area. Concretely, the discharge wire 200 having a diameter of 0.2 mm was moved in the direction indicated by the arrow, and thereby, a cutting process was carried out on the material 100. In this case, as shown in FIG. 2, the discharge wire 200 was passed through the slit 420 in a state where the material 100 was pinched by the jig 400, which was secured by screws, and thus, the material 100 was cut in accordance with the discharging process. When cutting was completed in one slit 420, the discharge wire 200 was automatically cut and moved to an adjacent slit 420, where the wire was automatically connected and the material 100 was sequentially cut in accordance with the discharging process. At this time, as shown in FIG. 1(E), the cutting process was carried out on the material 100, a process for roughly finishing the cut surfaces that had been gained through this cutting process was carried out, and a process for finely finishing the cut surfaces was carried out by reciprocating the discharge wire 200 three times relative to the material 100. The discharging process conditions at this time were a voltage of 45 V, a current of 5 A and a moving speed of the discharge wire of 1.0 mm/min for the cutting process, a voltage of 60 V, a current of 0.5 A and a moving speed of the discharge wire of 1.0 mm/min for the roughly finishing process, and a voltage of 30 V, a current of 20 A and a moving speed of the discharge wire of 15 mm/min for the finely finishing process. The amounts of offset in the roughly finishing process and in the finely finishing process were 0.122 mm and 0.110 mm, respectively. In this manner, as shown in FIG. 1(F), materials 50 cut at equal intervals in one direction were gained. After that, the jig 400 in FIG. 2 was rotated by 90°, and thereby, the materials 50 cut at equal intervals in one direction were rotated by 90°, and then, as shown in FIG. 1(G), the discharge wire 200 was placed approximately parallel to the main surface of the materials 50 having a relatively large area, and the discharging process was carried out on the secondary surfaces having a relatively small area. At this time, the cutting process was carried out on the materials 50, the process for roughly finishing the cut surfaces that had been gained through this cutting process was carried out, and the process for finely finishing the cut surfaces was carried out in the same manner as that shown in FIG. 1(E) by reciprocating the discharge wire 200 three times relative to the materials 50. As a result, the materials were converted to chips as shown in FIG. 1(H), and thus, the heat sink materials 10 were gained. As shown in FIG. 1(I), the heat sink material 10 had dimensions of x=10 mm, y=2 mm and z=0.3 mm.

(Discharging Process 6)

Figure 5:
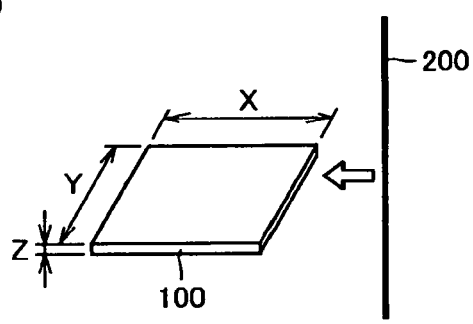
FIG. 5 is a diagram showing the sequence of steps in a manufacturing method for a heat sink material according to another comparative example of this invention.
Figure 5:
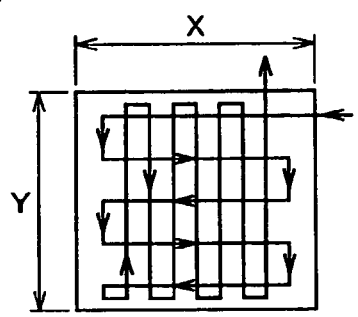
Figure 5:
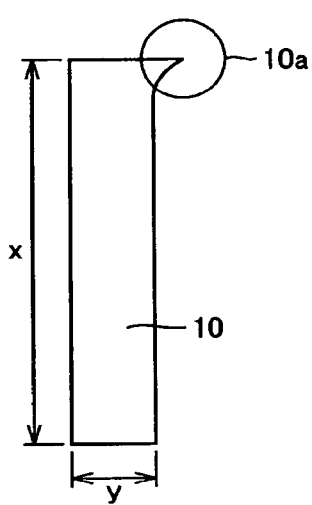

As shown in FIG. 5(A), the material 100 having dimensions of X=38 mm, Y=38 mm and Z=0.3 mm was prepared. The upper and lower surfaces were processed by means of lapping so that the thickness (Z) became 0.3 mm. After that, as shown in FIG. 5(A), the discharge wire 200 was placed approximately perpendicular to the main surface of the material 100 having a relatively large area, and thus, a discharging process was carried out on the secondary surface having a relatively small area. Concretely, as shown in FIG. 5(B), the discharge wire 200 having a diameter of 0.2 mm was moved in the direction indicated by the arrow, and thereby, a cutting process was carried out on the material 100. The discharging process conditions at this time were a voltage of 45 V, a current of 10 A and a moving speed of the discharge wire of 3.0 mm/min for the cutting process. In this manner, the materials were converted into chips as shown in FIG. 5(C), and thus, the heat sink material 10 was gained. As shown in FIG. 5(C), the cross section of the heat sink material 10 had dimensions of x=10 mm and y=2 mm, and a protrusion 10a remained after being cut off.

Due to this protrusion, a semiconductor laser element chip could not be mounted on the heat sink material 10 in Comparison Example 2.

(Dicing Process)

Figure 4:
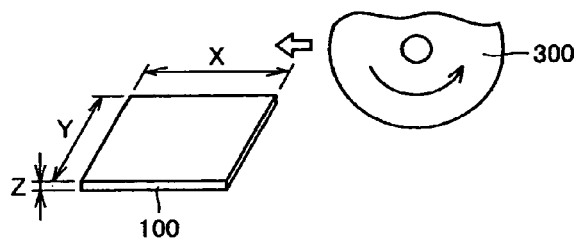
FIG. 4 is a diagram showing the sequence of steps in a manufacturing method for a heat sink material according to a comparative example of this invention.
Figure 4:
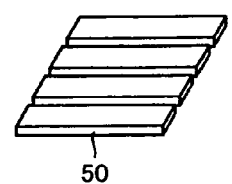
Figure 4:
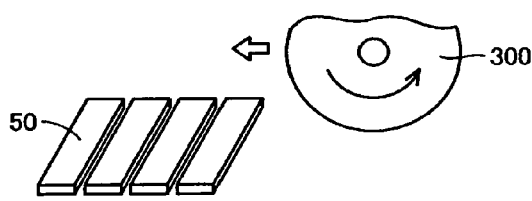
Figure 4:
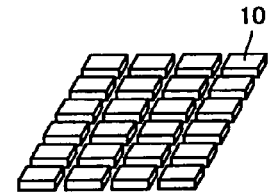
Figure 4:
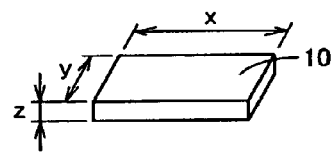

As shown in FIG. 4(A), the material 100 having dimensions of X=38 mm, Y=38 mm and Z=0.3 mm was prepared. The upper and lower surfaces were processed by means of lapping so that the thickness (Z) became 0.3 mm. After that, as shown in FIG. 4(A), a cutting process was carried out by placing a rotary grinder or a dicing blade (diamond blade) 300 approximately perpendicular to the main surface of the material 100 having a relatively large area. In this manner, as shown in FIG. 4(B), materials 50 cut in one direction at equal intervals were gained. After that, the materials 50 cut in one direction at equal intervals were rotated by 90° and, as shown in FIG. 4(C), a cutting process was carried out by placing the rotary grinder or the dicing blade 300 approximately perpendicular to the main surface of the materials 50 having a relatively large area. In this manner, the materials were converted to chips, as shown in FIG. 4(D), and thus, the heat sink material 10 was gained. The gained heat sink material 10 was mounted in a barrel pot so as to be mixed with a dummy powder or stones, and barrel polishing was carried out, and thereby, burrs on the cut surfaces were removed. As shown in FIG. 4(E), the heat sink material 10 has dimensions of x=10 mm, y=2 mm and z=0.3 mm.

In Comparative Example 3, the material made of a Cu-diamond composite material could not be cut in accordance with a dicing process. In addition, though the material made of a Cu-diamond composite material was attempted to be cut by means of a laser beam, diamond particles which exist on the edge portions on the cut surface were converted to graphite, and when a nickel film was vapor deposited or a solder layer of a gold-tin alloy was formed in post processing, good adhesion could not be gained.

The form of the edge surface of the heat sink materials 10 gained from the respective samples as described above was observed and evaluated. The results (existence of burrs, degree of sagging, size and number of chipped portions (chipping)) are shown in Table 1.

Figure 3:
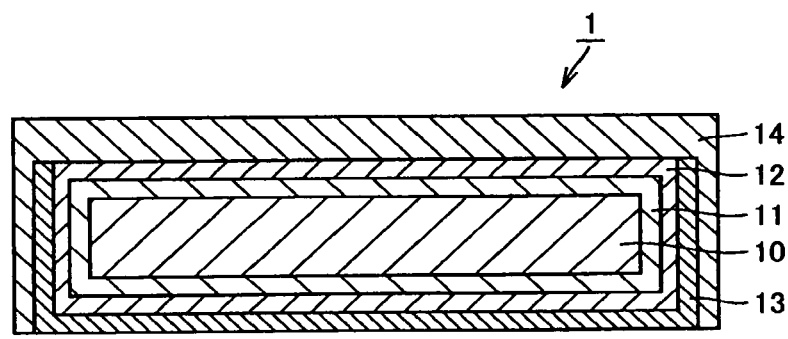
FIG. 3 is a cross sectional diagram schematically showing a cross section of a heat sink gained in accordance with an example of this invention.

As shown in FIG. 3, a nickel (Ni) plating layer or a nickel vapor deposited layer 11 having a thickness of 1 μm was formed so as to cover the main surfaces and secondary surfaces of the heat sink material 10 fabricated from each sample, and after that, a platinum (Pt) film 12 having a thickness of 0.2 μm was vapor deposited on this nickel plating layer or nickel vapor deposited layer 11. Furthermore, a gold (Au) film 13 having a thickness of 0.6 μm was vapor deposited on top of the platinum film 12 on the main surface on the lower side and on the secondary surfaces, which are sides continuing to this main surface on the lower side. In addition, through vapor deposition, a solder layer 14 was formed of a gold-tin (Au—Sn) alloy having a thickness of 3.0 μm on the platinum film 12 and gold film 13 on the main surface on the upper side on which a semiconductor laser element chip was to be mounted and on the secondary surfaces which are sides continuing to this main surface on the upper side. In this manner, a heat sink 1 was fabricated.

Figure 6:
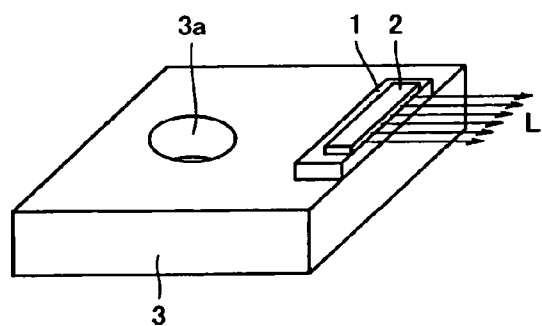
FIG. 6 is a diagram schematically showing the configuration of semiconductor laser devices formed using heat sink materials gained according to examples and comparative examples of this invention.
Figure 6:
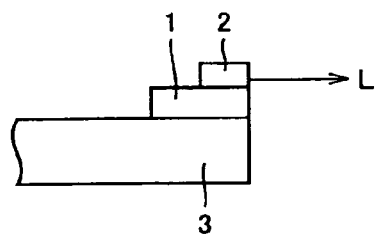
Figure 6:
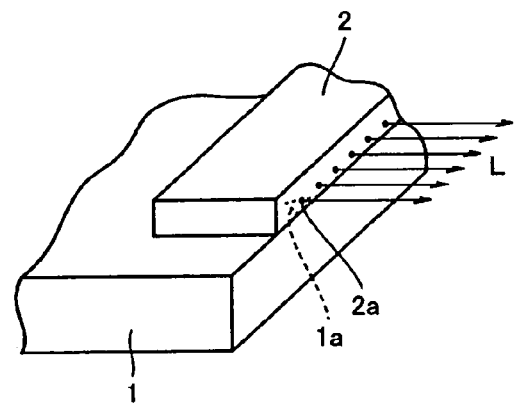
Figure 6:
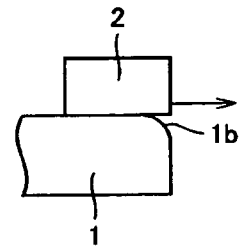
Figure 6:
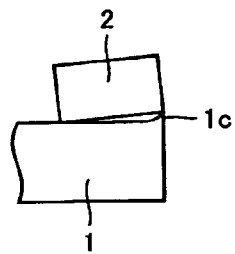

After that, as shown in FIG. 6(A), the heat sink 1 is heated and joined to the top of a base 3 made of copper, and a semiconductor laser element chip for a bar laser 2 of which the base material is made of a gallium arsenic compound semiconductor material (coefficient of linear expansion: $5.9 \times 10^{-6}$/K) was mounted on top of the heat sink 1 via the solder layer 14 through heating, joining and securing. At this time, as shown in FIG. 6(B), the semiconductor laser element chip 2 was mounted on top of the heat sink 1 so as to be aligned with the edge (edge portion) of the heat sink 1. More concretely, the semiconductor laser element chip 2 was mounted on top of the heat sink 1 in such a manner that the end surface of the light emitting layer (active layer) of the semiconductor laser element chip 2 was positioned on top of the main surface at a distance of within 10 μm from the end of the heat sink 1 where the main surface and the secondary surface cross. In this manner, a semiconductor laser device was formed.

As shown in FIG. 6(A), a hole 3a for securing the base 3 of copper to another member was provided. In FIGS. 6(A), 6(B) and 6(C), laser beams are emitted in the direction indicated by arrows L. Portions from which a laser beam is emitted 2a are formed and aligned in the light emitting layer of the semiconductor laser element chip 2 at intervals of approximately 100 μm pitch.

As shown in FIG. 6(C), in the case where a large chipped portion (chipping) 1a exists on the end surface of the heat sink 1 directly beneath the portion from which a laser beam is emitted 2a, it becomes difficult to release generated heat, and therefore, heat is prevented from being released from the semiconductor laser element chip 2 to the heat sink 1. In addition, as shown in FIG. 6(D), in the case where an approximate radius of curvature (sagging from the end surface) 1b in the edge portion (edge) of the heat sink 1 where the main surface and the secondary surface cross is great, heat is prevented from being released from the portion directly beneath the laser emitting layer (active layer) to the heat sink 1. Furthermore, as shown in FIG. 6(E), in the case where there is a burr 1c in the edge portion (edge) of the heat sink 1, that is to say, on the end surface, where the main surface and the secondary surface cross, there is a gap between the semiconductor laser element chip 2 and the main surface of the heat sink 1, and therefore, heat is prevented from being released from the semiconductor laser element chip 2 to the heat sink 1.

The maximum output (W) of the laser beam of each sample and the time over which this maximum output can be maintained, which is the lifetime, were measured under conditions of an applied current of 50 A and an applied voltage of 4 V, using the gained semiconductor laser device. The result is shown in Table 1.

TABLE 1

| Sample No. | Material | Conditions for cutting process | Form of end surface | | | Maximum output (W) | Lifetime (time) |
| --- | --- | --- | --- | --- | --- | --- | --- |
| | | | Existence of burr | Sagging R (μm) | Chipping W μm × L μm (number) | | |
| Example 1 | Cu—W alloy 1 | Discharging process 3 | No | 5 | 5 × 10 (3) | 60 | 25000 |
| Example 2 | Cu—W alloy 1 | Discharging process 4 | No | 10 | 15 × 30 (5) | 50 | 25000 |
| Example 3 | Cu—W alloy 1 | Discharging process 5 | No | 20 | 10 × 30 (5) | 45 | 20000 |
| Example 4 | Cu—W alloy 2 | Discharging process 3 | No | 5 | 5 × 10 (3) | 60 | 25000 |
| Example 5 | Cu—W alloy 3 | Discharging process 3 | No | 5 | 5 × 10 (4) | 60 | 20000 |
| Example 6 | Cu-diamond | Discharging process 3 | No | 20 | 30 × 40 (8) | 80 | 25000 |
| Example 7 | Al—SiC | Discharging process 3 | No | 5 | 20 × 30 (8) | 40 | 25000 |
| Example 8 | Cu—W alloy 1 | Discharging process 1 | Yes | 45 | 45 × 30 (15) | 30 | 15000 |
| Example 9 | Cu—W alloy 1 | Discharging process 2 | Yes | 38 | 35 × 58 (14) | 40 | 17000 |
| Comparative Example 1 | Cu—W alloy 1 | Dicing process | Yes | 40 | 5 × 20 (18) | 40 | 15000 |
| Comparative Example 2 | Cu—W alloy 1 | Discharging process 6 | Yes | 40 | 40 × 55 (—) | — | — |
| Comparative Example 3 | Cu-diamond | Dicing process | — | — | — | — | — |
| Comparative Example 4 | Cu | Dicing process | No | 3 | 5 × 10 (2) | 70 | 1000 |

It can be seen from the results shown in Table 1 that in the case where at least one of the heat sink materials according to Examples 1 to 9 having an end surface gained by carrying out the discharging process on the secondary surface using the discharge wire that is placed approximately parallel to the main surface is used, the semiconductor laser element chip can be mounted on top of the heat sink without carrying out post processing, for example a polishing process for removing burrs from the cut surface, and furthermore, an edge (edge portion) having a small radius of curvature and small chipped portions can be gained and burrs can be prevented from being created in the edge portion in the heat sink materials according to Examples 1 to 7 by carrying out the discharging process on the end surface. That is to say, the approximate radius of curvature (sagging R) can be made no greater than 30 μm in the edge portion (edge) of the heat sink material, where the main surface and the secondary surface cross, and the number of chipped portions (chipping) having a width of no greater than 30 µm and a length of no greater than 50 µm per 1 mm on the length of the edge can be made no greater than 10, and thus, burrs can be prevented from being created in the edge portion. As a result, when a laser element is mounted on top of the heat sink material so that the end surface of the laser emitting layer is aligned with the edge portion of the heat sink material, heat can be effectively released from the portion directly beneath the laser emitting layer (active layer) to the heat sink material, and therefore, the maximum output of the laser beam can be increased, and at the same time, the time over which this maximum output can be maintained, that is to say, the lifetime of the laser element, can be prolonged.

The embodiments and examples disclosed in the above are illustrative in all respects, and should not be considered as being limitative. The scope of the present invention is defined not by the above described embodiments and examples, but by the claims, and includes meanings equivalent to the claims and all the modifications and variations within the scope.

INDUSTRIAL APPLICABILITY

According to this invention, a heat sink material having an end surface which makes the formation of an edge portion on which at least a laser element is mounted possible can be gained, and when a further discharging process is carried out on this heat sink material, an edge portion having a small radius of curvature and small chipped portions can be gained, so that burrs are prevented from being created in the edge portion, and thus, heat release from the laser element to the heat sink material can be improved. Therefore, the heat sink material according to this invention is appropriate for use as a heat sink material for a semiconductor laser element (laser diode (LD)) for a bar laser.

The invention claimed is:

1. A manufacturing method for a heat sink material, comprising the steps of:
   placing a discharge wire, on a material made of an alloy or a composite material including two or more types of elements, the material comprising a main surface which has a relatively large area and a secondary surface which has a relatively small area and which crosses said main surface at an edge where said main surface and said secondary surface cross, to be approximately parallel to said main surface,
   wherein said secondary surface is a surface on which a discharging process has previously been carried out using the discharge wire that is placed approximately parallel to said main surface;
   cutting said material by a discharging process using said placed discharge wire, such that an approximate radius of curvature at said edge is no greater than 30 µm;
   roughly finishing the cut surface by a discharging process using said placed discharge wire; and
   finely finishing the cut surface by a discharging process using said placed discharge wire,
   wherein an amount of offset in the discharging process is set to be no greater than 100% of the diameter of the discharge wire, in the step of roughly finishing the cut surface and in the step of finely finishing the cut surface, such that a number of chipped portions, which exist per 1 mm on a length of the edge portion on said secondary surface and have a width of no greater than 30 µm and a length of no greater than 50 µm, is no greater than 10.

* * * * *